US011532681B2

(12) United States Patent
Yang et al.

(10) Patent No.: US 11,532,681 B2
(45) Date of Patent: Dec. 20, 2022

(54) DISPLAY PANEL INCLUDING INSULATION LAYER

(71) Applicant: WUHAN CHINA STAR OPTOELECTRONICS SEMICONDUCTOR DISPLAY TECHNOLOGY CO., LTD., Hubei (CN)

(72) Inventors: Jie Yang, Hubei (CN); Ming Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 743 days.

(21) Appl. No.: 16/471,733

(22) PCT Filed: Feb. 26, 2019

(86) PCT No.: PCT/CN2019/076167
§ 371 (c)(1),
(2) Date: Jun. 20, 2019

(87) PCT Pub. No.: WO2020/118909
PCT Pub. Date: Jun. 18, 2020

(65) Prior Publication Data
US 2021/0359050 A1    Nov. 18, 2021

(30) Foreign Application Priority Data
Dec. 13, 2018   (CN) .......................... 201811528684.7

(51) Int. Cl.
*H01L 27/32*     (2006.01)
*H01L 51/52*     (2006.01)

(52) U.S. Cl.
CPC ...... *H01L 27/3258* (2013.01); *H01L 27/3276* (2013.01); *H01L 51/5206* (2013.01); *H01L 2227/323* (2013.01); *H01L 2251/301* (2013.01)

(58) Field of Classification Search
CPC ... H01L 27/3244–3279; H01L 51/5253–5256; H01L 51/0097; H01L 2251/5538
See application file for complete search history.

(56) References Cited

U.S. PATENT DOCUMENTS

| 6,522,079 B1 * | 2/2003 | Yamada | H01L 27/3276 313/500 |
| 2001/0019133 A1 * | 9/2001 | Konuma | H01L 27/1248 257/40 |

(Continued)

FOREIGN PATENT DOCUMENTS

| CN | 101383374 A * | 3/2009 |
| CN | 104716156 A | 6/2015 |

(Continued)

OTHER PUBLICATIONS

International Search Report dated Sep. 19, 2019, in connection with the International Patent Application No. PCT/CN2019/076167.

*Primary Examiner* — Steven B Gauthier
*Assistant Examiner* — Candice Chan
(74) *Attorney, Agent, or Firm* — Hauptman Ham, LLP

(57) ABSTRACT

A display panel is provided, including a substrate and an organic light-emitting component disposed on the substrate. The display panel further includes a planarization layer and an insulation layer disposed on the planarization layer. An anode of the organic light-emitting component is disposed on the planarization layer. The insulation layer is disposed on the planarization layer and configured to cover the planarization layer, and the anode of the organic light-emitting component is exposed through the insulation layer.

11 Claims, 4 Drawing Sheets

(56) References Cited

U.S. PATENT DOCUMENTS

| | | | |
|---|---|---|---|
| 2009/0058280 A1 | 3/2009 | Jo et al. | |
| 2016/0293883 A1 | 10/2016 | Hong et al. | |
| 2017/0005118 A1 | 1/2017 | Yamazaki et al. | |
| 2018/0069193 A1 | 3/2018 | Hong et al. | |
| 2018/0329552 A1* | 11/2018 | Song | H01L 27/323 |
| 2018/0342696 A1 | 11/2018 | Hong et al. | |
| 2019/0334117 A1 | 10/2019 | Hong et al. | |
| 2020/0150847 A1* | 5/2020 | Jang | H01L 51/5246 |

FOREIGN PATENT DOCUMENTS

| | | |
|---|---|---|
| CN | 106057848 A | 10/2016 |
| CN | 107464832 A | 12/2017 |
| CN | 108172601 A | 6/2018 |
| CN | 108550617 A | 9/2018 |
| CN | 109037289 A | 12/2018 |
| KR | 20130110987 A | 10/2013 |

* cited by examiner

DISPLAY PANEL INCLUDING INSULATION LAYER

FIELD OF INVENTION

The present disclosure relates to the field of display panel technologies, and in particular, to a power line, especially a display panel in which an insulation layer is disposed on a VSS signal line.

BACKGROUND OF INVENTION

An organic light-emitting diode (OLED) display device features self-illumination, a simple structure, an ultra light and thin body, a high response speed, wide viewing angles, low power consumption, implementation of flexible display, and the like, and is therefore widely applied to the display field.

Flexible OLED display devices gradually dominate the market because they feature a flexible and light and thin body. A display device having a high screen-to-body ratio and even a full-screen display device have become focuses in production and study.

For a display panel of a mobile phone, currently, a front-facing camera, an earpiece, and the like are often disposed on an upper frame of the display panel, and a binding area is disposed on a lower frame of the display panel. In comparison with a liquid crystal display (LCD) panel, in an OLED display panel, a binding area can be bent, so that a size of a lower frame can be effectively reduced.

FIG. 1 is a schematic diagram of an OLED display panel in the prior art. As shown in FIG. 1, the display panel 1 includes a substrate 101, and an organic light-emitting component 20 and a VSS signal line 30 that are disposed on the substrate 101. The organic light-emitting component 20 includes an anode 21, an organic layer 22, and a cathode 23. To implement a full screen, no cathode contact area is disposed on a lower frame, to reduce a size of the lower frame. That is, as shown in FIG. 1, the cathode 23 of the organic light-emitting component 20 does not contact with the VSS signal line 30.

Technical Problem

For a cathode evaporation process of a cathode film layer, because of manufacturing precision of a mask, a short circuit between the cathode 23 of the organic light-emitting component 20 and the VSS signal line 30 shown in FIG. 1 is very easily caused. That is, the cathode film layer of the cathode 23 is evaporated on the VSS signal line 30, as shown in FIG. 1, affecting a yield rate of a product.

Therefore, a new display panel structure is required, to prevent the foregoing problem.

SUMMARY OF INVENTION

An objective of the present disclosure is to provide a display panel, to prevent a short circuit between a cathode of an organic light-emitting component and a power line especially a VSS signal line outside a cathode contact area by disposing an insulation layer and by using a structural design of the insulation layer, thereby further reducing a frame size and implementing a narrow-frame display panel having a high yield rate.

To achieve the foregoing objective, the present disclosure provides a display panel, including: a substrate; a metal layer disposed on the substrate, where the metal layer including a plurality of power lines including a VSS signal line; a planarization layer formed over the substrate and disposed on the metal layer, where the planarization layer covers the metal layer, and at least a part of the VSS signal line is exposed through the planarization layer; an anode of an organic light-emitting component disposed on the planarization layer; and an insulation layer disposed on the planarization layer. The insulation layer covers the planarization layer and at least the part of the VSS signal line which is exposed, and the anode of the organic light-emitting component is exposed through the insulation layer. A thickness of the insulation layer ranges between 50 nm and 1000 nm. Resistance of the insulation layer is greater than $10^6$ ohms.

The present disclosure further provides a display panel, including a substrate, a planarization layer disposed on the substrate, and an organic light-emitting component disposed on the planarization layer. The display panel further includes an insulation layer disposed on the planarization layer. An anode of the organic light-emitting component is disposed on the planarization layer. The insulation layer is disposed on the planarization layer and configured to cover the planarization layer, and the anode of the organic light-emitting component is exposed through the insulation layer.

In an embodiment, the display panel further includes a metal layer disposed on the substrate. The planarization layer is disposed on the metal layer and configured to cover the metal layer, and a part of the metal layer is exposed through the planarization layer, so that the insulation layer contacts with and covers the part of the metal layer that is exposed.

In an embodiment, the metal layer includes a plurality of power lines. At least a portion of the plurality of power lines is exposed through the planarization layer, so that the insulation layer contacts with and covers the at least the portion of the plurality of power lines that is exposed.

In an embodiment, the plurality of power lines includes a VSS signal line. At least a part of the VSS signal line is exposed through the planarization layer, so that the insulation layer contacts with and covers at least the part of the VSS signal line which is exposed.

In an embodiment, the display panel includes a display area and a non-display area. The non-display area includes a bending area. A portion of the VSS signal line close to the bending area is exposed through the planarization layer, so that the insulation layer at least partially contacts with and covers the portion of the VSS signal line which is exposed and close to the bending area.

In an embodiment, the insulation layer completely contacts with and covers the portion of the VSS signal line which is exposed and close to the bending area.

In an embodiment, the display panel further includes a plurality of barriers disposed on the substrate and configured to block an organic layer of the organic light-emitting component, and an edge of the insulation layer does not exceed the barriers.

In an embodiment, a thickness of the insulation layer ranges between 50 nm and 1000 nm.

In an embodiment, resistance of the insulation layer is greater than $10^6$ ohms.

In an embodiment, the insulation layer is made of an inorganic insulation material, for example, but not limited to, silicon nitride or silica.

Beneficial Effect

In the present disclosure, a short circuit between a cathode of an organic light-emitting component and a power line especially a VSS signal line outside a cathode contact area is prevented by disposing an insulation layer and by using a structural design of the insulation layer, thereby further reducing a frame size and implementing a narrow-frame display panel having a high yield rate.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following descriptions merely show some embodiments of the present disclosure, and a person skilled in the art may still derive other drawings from these accompanying drawings without creative efforts.

DETAILED DESCRIPTION OF PREFERRED EMBODIMENTS

Figure 1:
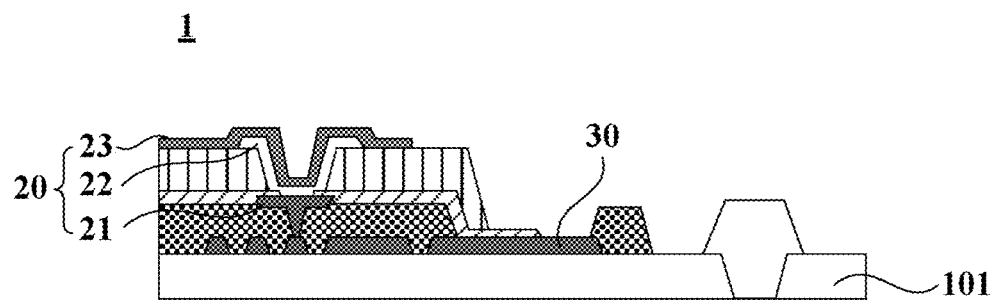
FIG. 1 is a schematic diagram of a display panel in the prior art.

The following describes in detail implementations of the present invention. Examples of the implementations are shown in the accompanying drawings, where reference numerals that are the same or similar from beginning to end represent same or similar components or components that have same or similar functions. The following implementations described with reference to the accompanying drawings are exemplary, which are used merely to explain the present invention, and cannot be construed as a limit to the present invention.

In the present invention, unless otherwise explicitly stipulated and restricted, that a first feature is "on" or "under" a second feature may include that the first and second features are in direct contact, or may include that the first and second features are not in direct contact but in contact by using other features therebetween. In addition, that the first feature is "on", "above", or "over" the second feature includes that the first feature is right above and on the inclined top of the second feature or merely indicates that a level of the first feature is higher than that of the second feature. That the first feature is "below", "under", or "beneath" the second feature includes that the first feature is right below and at the inclined bottom of the second feature or merely indicates that a level of the first feature is lower than that of the second feature.

Many different implementations or examples are provided in the following disclosure to implement different structures of the present invention. To simplify the disclosure of the present invention, components and settings in particular examples are described below. Certainly, they are merely examples and are not intended to limit the present invention. In addition, in the present invention, reference numerals and/or reference letters may be repeated in different examples. The repetition is for the purposes of simplification and clearness, and a relationship between various discussed implementations and/or settings is not indicated. Moreover, the present invention provides examples of various particular processes and materials, but a person of ordinary skill in the art may be aware of application of another process and/or use of another material.

Figure 2:
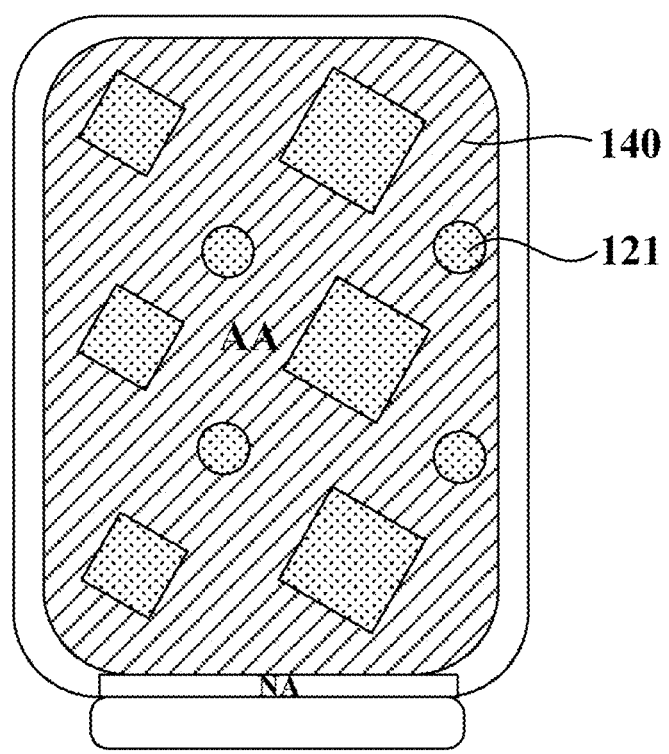
FIG. 2 is a top view of a display panel according to an embodiment of the present disclosure.
Figure 3:
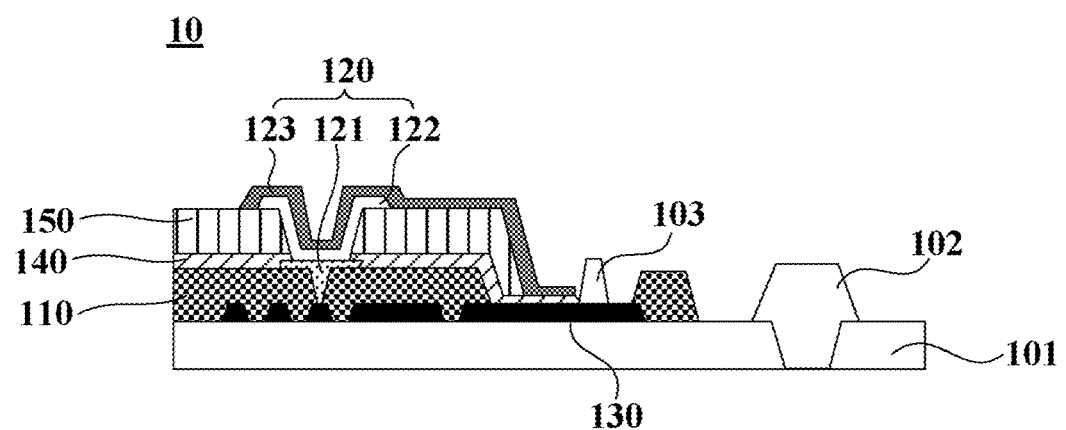
FIG. 3 is a schematic diagram of a display panel according to an embodiment of the present disclosure.

As shown in FIG. 2, an embodiment provides a display panel 10, including a display area AA and a non-display area NA. As shown in FIG. 2 and FIG. 3, the non-display area NA of the display panel 10 includes a bending area 102. The display panel 10 includes a substrate 101, a planarization layer 110 disposed on the substrate 101, and an organic light-emitting component 120 disposed on the planarization layer 110 and configured to display an image. The organic light-emitting component 120 includes an anode 121, an organic layer 122, and a cathode 123. A person skilled in the art may understand that, a complete thin film transistor and a metal layer including a plurality of power lines are formed on the substrate 101. In the present embodiment, the plurality of power lines includes a VSS signal line 130.

As shown in FIG. 3, the planarization layer 110 covers the VSS signal line 130, and the VSS signal line 130 is exposed through the planarization layer 110. Especially, a part of the VSS signal line 130 close to the bending area 102 is exposed through the planarization layer 110. The organic light-emitting component 120 is disposed on the planarization layer 110. In details, the anode 121 of the organic light-emitting component 120 is located on the planarization layer 110.

As shown in FIG. 3, an insulation layer 140 is disposed on the anode 121. The insulation layer 140 covers the planarization layer 110, to partially come into contact with the anode 121 of the organic light-emitting component 120 and the VSS signal line 130. As shown in FIG. 2 and FIG. 3, the anode 121 is exposed through the insulation layer 140, that is, the insulation layer 140 is provided with an opening at a position corresponding to the anode 121.

Still referring to FIG. 3, the display panel 10 further includes a plurality of barriers 103 configured to block the organic layer 122 of the organic light-emitting component 120, and an edge of the insulation layer 140 does not exceed the barriers 103. In addition, as shown in FIG. 3, a pixel definition layer 150 is disposed on the insulation layer 140, the organic layer 122 of the organic light-emitting component 120 is disposed on the pixel definition layer 150, and the cathode 123 is disposed on the organic layer 122.

In the present embodiment, the insulation layer 140 is made of an inorganic insulation material, for example, but not limited to, silicon nitride or silica. Resistance of the insulation layer 140 is greater than $10^6$ ohms, and a thickness of the insulation layer 140 is within a range of 50 nm to 1000 nm.

A method for manufacturing the display panel 10 is described below with reference to FIG. 4A and FIG. 4B.

Figure 4A:
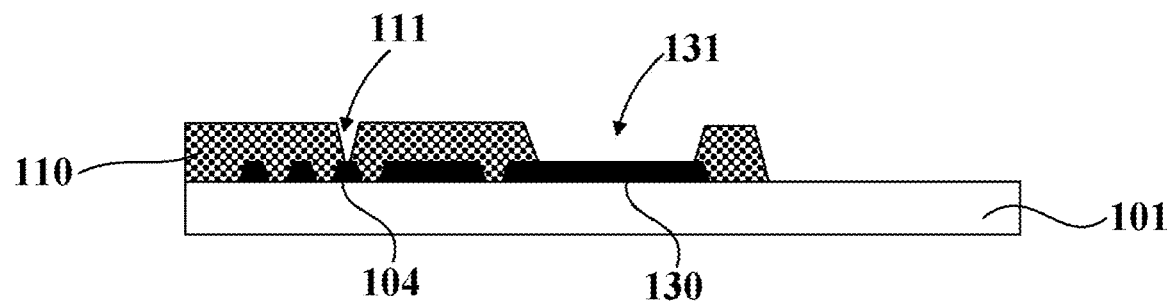
FIG. 4A to FIG. 4E are schematic diagrams showing a manufacturing process of a display panel according to an embodiment of the present disclosure.

As shown in FIG. 4A, a clean substrate 101 formed with a complete thin film transistor and the VSS signal line 130 is provided. A person skilled in the art may understand that, the VSS signal line 130 may be formed on a same layer as a source electrode and a drain electrode 104 of the thin film transistor. A planarization layer 110 is formed on the substrate 101 to cover the substrate 101. The planarization layer 110 is provided with a contact hole 111 for exposing the drain electrode 104 and a hole 131 for exposing the VSS signal line 130.

Figure 4B:
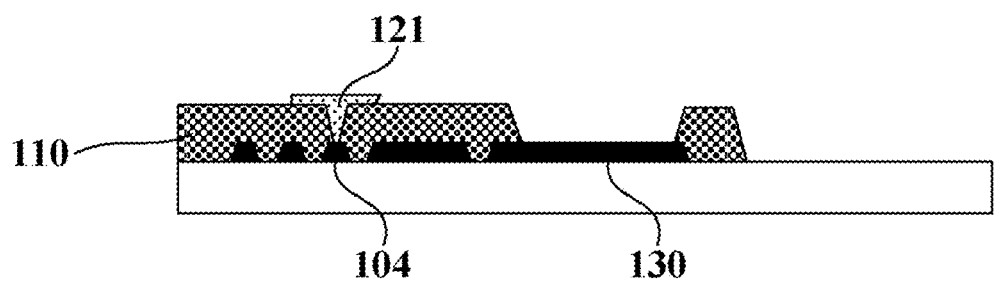

As shown in FIG. 4B, an anode 121 of an organic light-emitting component 120 is formed on the planarization layer 110, so that the anode 121 comes into contact with the drain electrode 104 of the thin film transistor through the contact hole 111 shown in FIG. 4A.

Figure 4C:
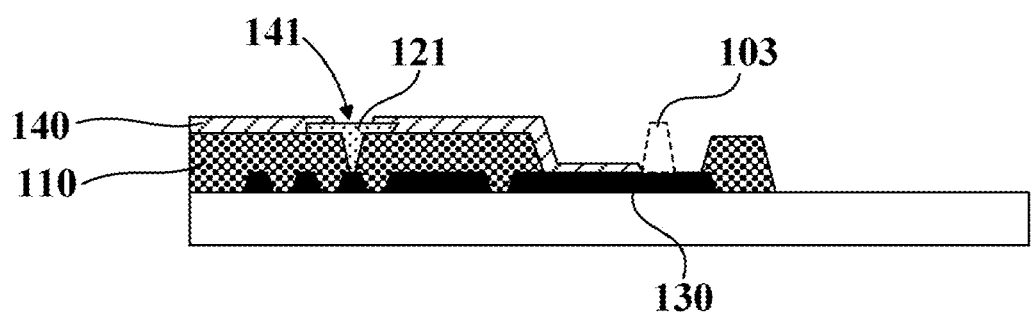

As shown in FIG. 4C, an insulation layer 140 is formed on the anode 121. The insulation layer 140 covers the planarization layer 110 and the anode 121, so that the insulation layer 140 comes into contact with and covers the VSS signal line 130 through the hole 131 shown in FIG. 4A. As shown in FIG. 4C, an edge of the insulation layer 140 does not exceed a plurality of barriers 103 configured to block an organic layer of the organic light-emitting component. However, in another embodiment of the present disclosure, the insulation layer 140 completely covers the VSS signal line 130. In addition, the insulation layer 140 is provided with an opening 141 for exposing the anode 121.

Figure 4D:
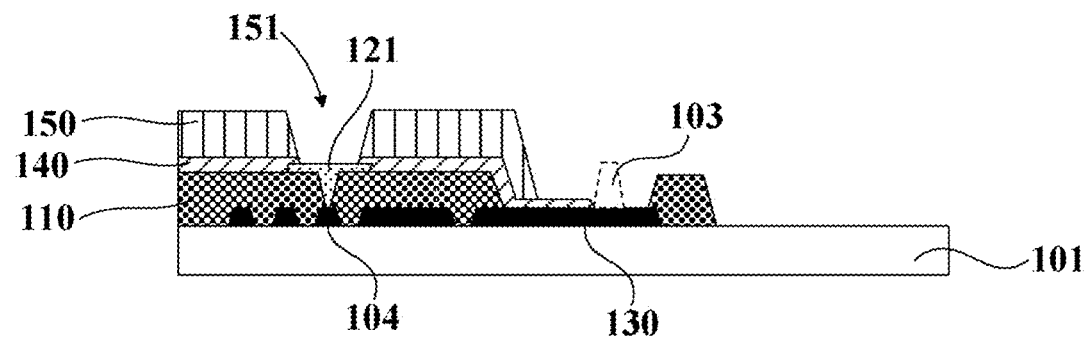

As shown in FIG. 4D, a pixel definition layer 150 is formed on the insulation layer 140, and the pixel definition layer 150 is provided with a contact hole 151 for exposing the anode 121.

Figure 4E:
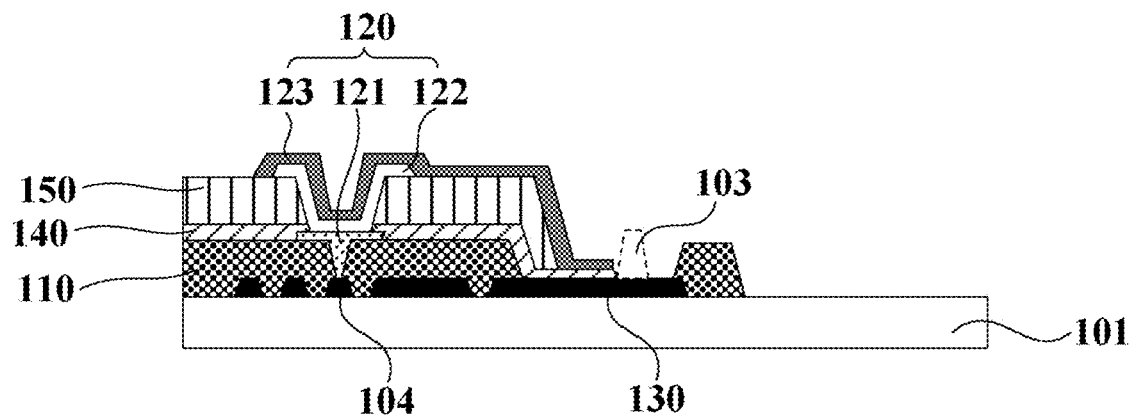

As shown in FIG. 4E, the organic layer 122 and a cathode 123 of the organic light-emitting component 120 are formed on the pixel definition layer 150. The organic layer 122 comes into contact with the anode 121 through the contact hole 151 shown in FIG. 4D and the opening 141 shown in FIG. 4C, to form the organic light-emitting component 120 configured to display an image.

According to a narrow-frame process requirement, the cathode 123 should not be evaporated to be located above the VSS signal line 130, as shown in FIG. 4E. However, because of manufacturing precision of a mask, usually, a case shown in FIG. 4E in which the cathode 123 is evaporated to be located above the VSS signal line 130 often occurs. In the present disclosure, because the VSS signal line 130 is covered by the insulation layer 140, even if the case shown in FIG. 4E in which the cathode 123 is evaporated to be located above the VSS signal line 130, a short circuit between the cathode 123 and the VSS signal line 130 is prevented.

The present disclosure is already described through the foregoing related embodiments, but the foregoing embodiments are merely examples for implementing the present disclosure. It should be noted that, the disclosed embodiments are not intended to limit the scope of the present disclosure. Conversely, modifications and equivalent settings falling within the spirit and the scope of the claims all fall within the scope of the present disclosure.

INDUSTRIAL APPLICABILITY

The subject matter in the present disclosure can be manufactured and used in the industry and has industrial applicability.

What is claimed is:

1. A display panel, comprising:
    a substrate;
    a metal layer disposed on the substrate, wherein the metal layer comprises a plurality of power lines comprising a VSS signal line;
    a planarization layer formed over the substrate and disposed on the metal layer, wherein the planarization layer covers the metal layer, and at least a part of the VSS signal line is exposed through the planarization layer;
    an anode of an organic light-emitting component disposed on the planarization layer; and
    an insulation layer disposed on the planarization layer, wherein the insulation layer covers the planarization layer and at least the part of the VSS signal line which is exposed, and the anode of the organic light-emitting component is exposed through the insulation layer; a thickness of the insulation layer ranges between 50 nm and 1000 nm; and resistance of the insulation layer is greater than 106 ohms.

2. The display panel according to claim 1, wherein the display panel comprises a display area and a non-display area; the non-display area comprises a bending area; and a portion of the VSS signal line close to the bending area is exposed through the insulation layer, so that the insulation layer at least partially contacts with and covers the portion of the VSS signal line which is exposed and close to the bending area.

3. The display panel according to claim 1, wherein the insulation layer is made of an inorganic insulation material.

4. A display panel, comprising a substrate, a planarization layer disposed on the substrate, and an organic light-emitting component disposed on the planarization layer, wherein the display panel further comprises an insulation layer disposed on the planarization layer; an anode of the organic light-emitting component is disposed on the planarization layer; and the insulation layer is disposed on the planarization layer and configured to cover the planarization layer, and the anode of the organic light-emitting component is exposed through the insulation layer, wherein the display panel further comprises:
    a metal layer disposed on the substrate;
    the planarization layer is disposed on the metal layer and configured to cover the metal layer and expose a part of the metal layer, so that the insulation layer contacts with and covers the part of the metal layer that is exposed; and
    the metal layer comprises a plurality of power lines, the plurality of power lines comprises a VSS signal line, and at least a part of the VSS signal line is exposed through the planarization layer, so that the insulation layer contacts with and covers at least the part of the VSS signal line which is exposed.

5. The display panel according to claim 4, wherein at least a portion of the plurality of power lines is exposed through the planarization layer, so that the insulation layer contacts with and covers at least the portion of the plurality of power lines that is exposed.

6. The display panel according to claim 5, wherein the display panel further comprises a display area and a non-display area; the non-display area comprises a bending area; and a portion of the VSS signal line close to the bending area is exposed through the planarization layer, so that the insulation layer at least partially contacts with and covers the portion of the VSS signal line which is exposed and close to the bending area.

7. The display panel according to claim 6, wherein the insulation layer completely contacts with and covers the portion of the VSS signal line which is exposed and close to the bending area.

8. The display panel according to claim 6, wherein the display panel further comprises a plurality of barriers disposed on the substrate and configured to block an organic layer of the organic light-emitting component, and an edge of the insulation layer does not exceed the barriers.

9. The display panel according to claim 4, wherein a thickness of the insulation layer ranges between 50 nm and 1000 nm.

10. The display panel according to claim 4, wherein resistance of the insulation layer is greater than 106 ohms.

11. The display panel according to claim 4, wherein the insulation layer is made of an inorganic insulation material.

* * * * *